United States Patent
Shabi et al.

(10) Patent No.: US 11,507,273 B2
(45) Date of Patent: Nov. 22, 2022

(54) DATA REDUCTION IN BLOCK-BASED STORAGE SYSTEMS USING CONTENT-BASED BLOCK ALIGNMENT

(71) Applicant: EMC IP Holding Company LLC, Hopkinton, MA (US)

(72) Inventors: Uri Shabi, Tel Mond (IL); Ronen Gazit, Tel Aviv (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 162 days.

(21) Appl. No.: 17/036,186

(22) Filed: Sep. 29, 2020

(65) Prior Publication Data

US 2022/0100385 A1    Mar. 31, 2022

(51) Int. Cl.
*G06F 3/06*    (2006.01)
*G06F 7/58*    (2006.01)
*H03M 7/30*    (2006.01)

(52) U.S. Cl.
CPC ............ *G06F 3/0608* (2013.01); *G06F 3/064* (2013.01); *G06F 3/0644* (2013.01); *G06F 3/0659* (2013.01); *G06F 3/0673* (2013.01); *G06F 7/582* (2013.01); *H03M 7/3086* (2013.01)

(58) Field of Classification Search
CPC ...... G06F 3/0608; G06F 3/064; G06F 3/0644; G06F 3/0659; G06F 3/0673; G06F 7/582; H03M 7/3086
See application file for complete search history.

(56) References Cited

U.S. PATENT DOCUMENTS

| 10,223,377 | B1 * | 3/2019 | Moghe | .................. G06F 16/185 |
| 10,783,078 | B1 | 9/2020 | Meiri et al. | |
| 2012/0084269 | A1 * | 4/2012 | Vijayan | .................. G06F 3/0608 707/E17.005 |
| 2013/0238570 | A1 * | 9/2013 | Rao | ........................ G06F 3/0619 707/E17.007 |

* cited by examiner

*Primary Examiner* — Larry T Mackall
(74) *Attorney, Agent, or Firm* — BainwoodHuang

(57) ABSTRACT

A method of data reduction in a block-based data storage system includes selecting a starting position in a block based on a deterministic function of block data content. Then for an unaligned block beginning at the selected starting position, a block digest (e.g., block hash) is generated and compared with stored block digests of stored data blocks. If there is a match, and the stored block matches the unaligned block, then a reference to the stored block is stored in place of the unaligned block, and otherwise the unaligned block and a corresponding digest are stored. The storing of references to already stored blocks, without the constraint of observing aligned-block boundaries, realizes increased savings of physical storage space.

16 Claims, 3 Drawing Sheets

DATA REDUCTION IN BLOCK-BASED STORAGE SYSTEMS USING CONTENT-BASED BLOCK ALIGNMENT

BACKGROUND

The present invention is related to the field of block-based data storage, and more particularly to block-based data storage systems providing data reduction services such as compression or deduplication.

SUMMARY

A technique is described for providing content-aware processing of data extents, with a fine (e.g., byte) granularity, to detect data identicality and provide data reduction in common scenarios, such as when extents differ only in small-offset shifting of file contents for example. The technique can enable a block storage device to detect granular shift (e.g., small number of bytes) between extents and once detected, apply a method to reduce redundant information and reduce physical storage utilization.

More particularly, a method is disclosed of data reduction in a block-based data storage system. The method includes selecting a starting position in a block based on a deterministic function of block data content, such as hashes of successive small segments of the block until a predefined hash value is matched. Then for an unaligned block beginning at the selected starting position, a fixed-size block digest (e.g., block hash) is generated and compared with stored block digests of stored data blocks. If the comparing results in a match, and the stored block is determined to actually match the unaligned block, then a reference to the stored block is stored in place of the unaligned block, and otherwise the unaligned block and a corresponding digest are stored. The storing of references to already stored blocks, without the constraint of observing aligned-block boundaries, realizes increased savings of physical storage space.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views.

DETAILED DESCRIPTION

Overview

Modern block-based data storage systems (also called "storage devices" herein) can support various methods to reduce physical storage space requirements and cost ($/GB) accordingly. Known methods include compression and block deduplication, which generally work on storage full page boundaries (e.g., naturally aligned 4 KB or 8 KB pages). Some newer methods may use a sub-page granularity such as a 512B block or sector granularity.

The files of file systems that are stored on block storage devices typically have much finer granularity, e.g., byte granularity, and an application may produce similar files with only very few or even a single byte offset inside the file data. For example, a word processing application may generate two versions of a document that differ in a single additional character or added/deleted word, so that the two document files are exactly the same up to the point of difference, and also the same after that point except for a small (byte-granular) shift in the contents. Similar results can be obtained for other applications such as spreadsheets, etc.

The known methods as outlined above would generally view all blocks after the difference point as different, just based on the shift in the contents, and would be unable to realize storage savings based on deduplicating such blocks accordingly. This is due in part to the constraint of operating at page or block/sector granularity.

The present disclosure provides a more content-aware method of detecting identical data blocks, with a much finer (e.g., byte) granularity, to readily detect and provide data reduction in common scenarios, such as the small-offset shifting of file contents as described above. The technique can enable a block storage device to detect byte granular shift (e.g., small number of bytes) between streams and once detected, apply a method to reduce redundant information and reduce physical storage utilization.

DESCRIPTION OF EMBODIMENTS

Figure 1:
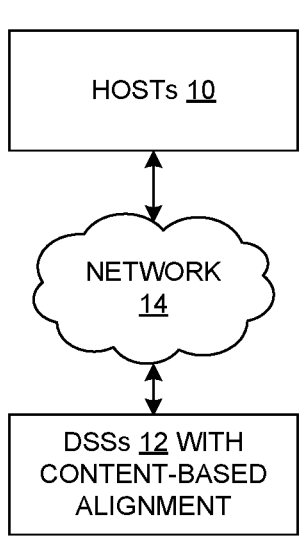
FIG. 1 is a block diagram of a distributed data processing system employing a data storage system with content-based block alignment as disclosed herein.

FIG. 1 shows a distributed data processing system having host computers (hosts) 10 and data storage systems 12 coupled together by a network 14. In general, such systems employ multiple data storage systems 12. In operation, the hosts 10 generate commands to write (store) data to the DSSs 12 and read (retrieve) previously written data from the DSSs 12, as generally known in the art. The DSSs 12 employ content-based alignment of data blocks realize improved data reduction as described further herein.

Figure 2:
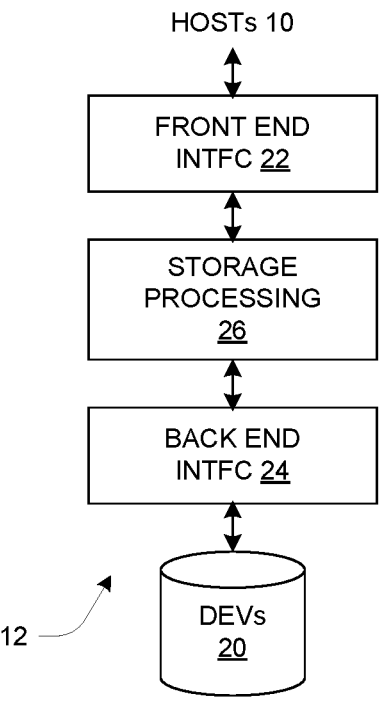
FIG. 2 is a block diagram of the data storage system.

FIG. 2 shows the general structure of a DSS 12. It includes physical storage devices (DEVs) 20 on which data is persistently stored, along with circuitry enabling access to the stored data by the hosts 10. The circuitry includes front-end interface circuitry 22 which interfaces to the hosts 10, back-end interface circuitry 24 which interfaces to the storage devices 20, and storage processing circuitry 26 that performs various operations involved in providing storage services to the hosts 10. The storage processing circuitry generally includes one or more processors, memory and I/O interface circuitry which functionally connects it to the interfaces 22, 24 for data transfer with the hosts 10 and devices 20. The memory stores computer program instructions that are executed by the processors to realize the storage functionality. Much of that functionality may be conventional and thus not elaborated herein. The present disclosure focuses on a particular aspect of operation related to data reduction and aspects of block writing and storage. Those skilled in the art will appreciate that the disclosed technique would be deployed as part of a comprehensive software-based system stored and executed by the storage processing circuitry 26.

Figure 3:
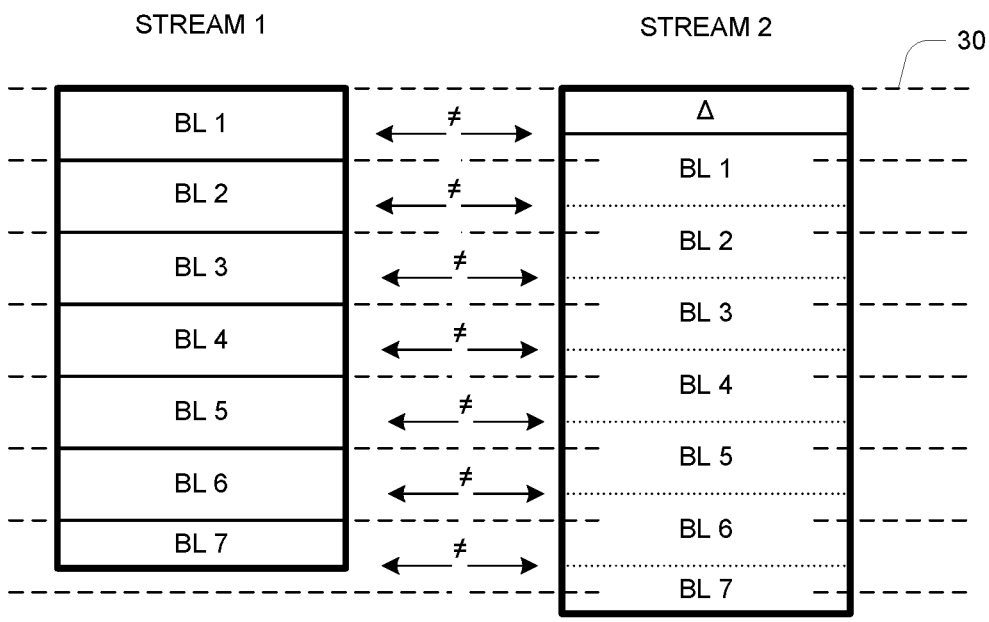
FIG. 3 is a schematic depiction of a relationship between two similar data streams that may not be handled well by known techniques.

FIG. 3 illustrates the above-discussed problem of known data reduction techniques. Two data streams Stream 1 and Stream 2 are shown, which may represent for example two files generated by an application such as a word processor. In this example, Stream 2 may have been created by modifying Stream 1, which is shown as an added section Δ. Otherwise the streams are identical, containing the same seven data blocks BL1-BL7 as shown. The streams are shown in relation to "aligned" block boundaries 30, which typically correspond to power-of-two block addresses. Thus for a 4K block size, for example, the boundaries 30 correspond to aligned block addresses such as 0x1234C000, 0x1234D000, 0x1234E000, . . . . Due to the addition of Δ, the remaining contents of Stream 2 are offset from those of Stream 1 as shown, and the corresponding aligned blocks do not match (indicated by the sign). The known methods as outlined above would generally view all the blocks in this example as different, just based on the shift in the contents, and would be unable to realize storage savings based on deduplicating such blocks accordingly. As noted above, this arises due to the constraint of operating at page or block/sector granularity.

Figure 4:
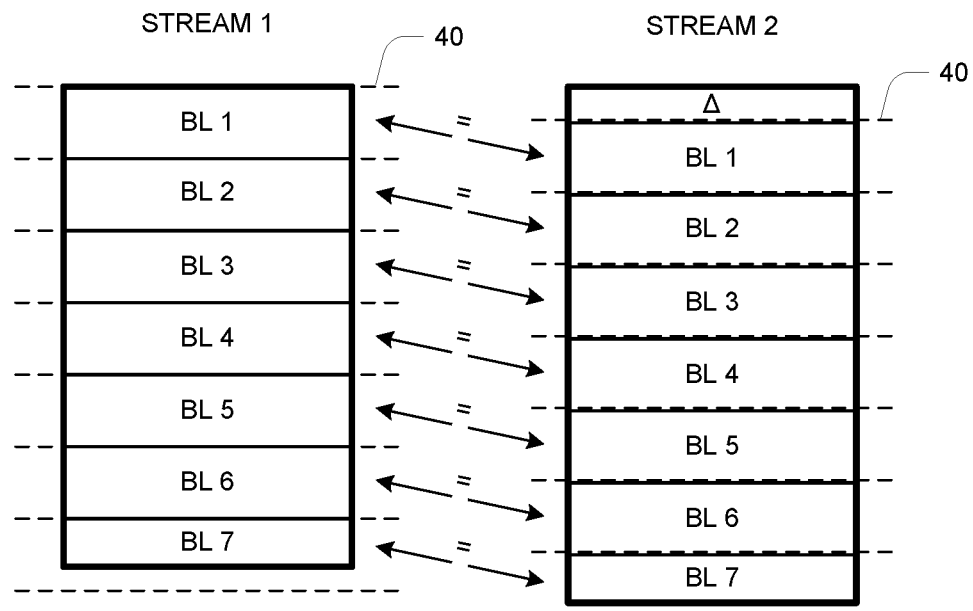
FIG. 4 is a schematic depiction of a relationship between two similar data streams with more desirable handling as may be accomplished using the presently disclosed technique.

FIG. 4 illustrates the same streams but now in relation to block boundaries 40 that are defined more in relation to the contents of the streams rather than by aligned block addresses. This content-based alignment is realized using a technique described more below, which enables a much greater opportunity for identifying blocks as identical and thus as candidates for data reduction. In this example, block boundaries 40 for Stream 2 are such that the blocks BL1-BL7 that match corresponding blocks of Stream 2 are defined, and the identicality of corresponding blocks is realized (indicated by the =sign).

Figure 5:
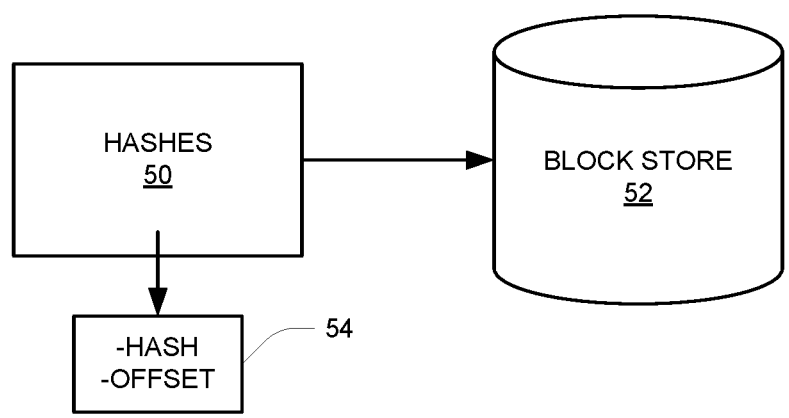
FIG. 5 is a block diagram illustrating the use of hashes in conjunction with stored data blocks.

FIG. 5 shows certain structure used in connection with the presently disclosed technique, which is a computationally efficient method for data reduction of high-granularity (e.g., byte granularity) modifications within data streams. The technique utilizes digests of stored blocks, which in one example may be hash values or "hashes" computed by hash functions. FIG. 5 shows this structure in simple form, with a collection of hashes 50 corresponding to data blocks in a block store 52 (residing on the physical devices 20). The stored blocks are generally unaligned such as illustrated in FIG. 4 (Stream 2), and thus as indicated the hash collection 50 includes, for each block in the block store 52, the block hash as well as an offset indicating its position relative to a nearest aligned block boundary 30.

Figure 6:
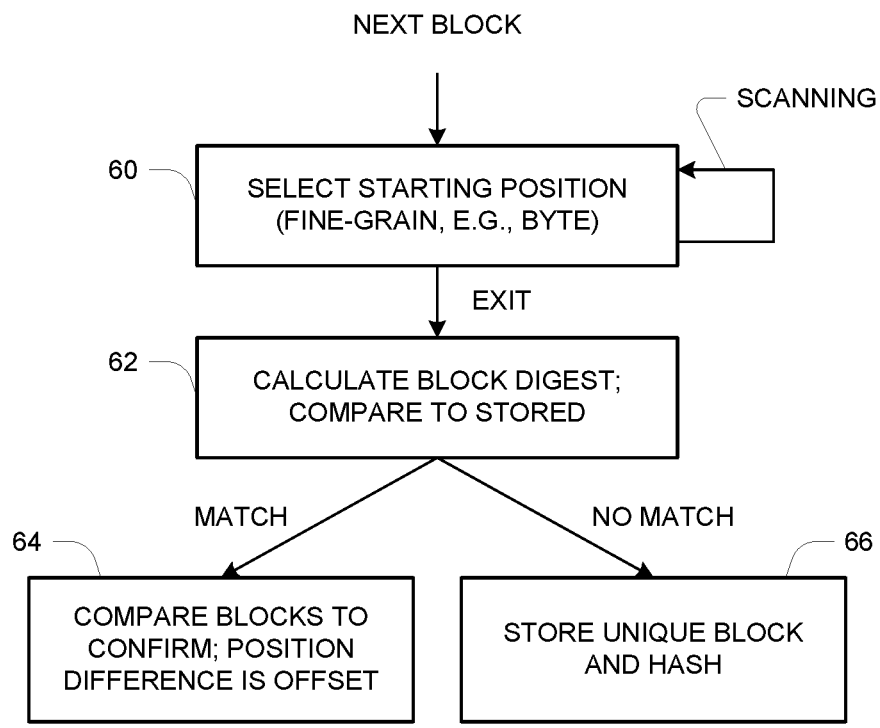
FIG. 6 is a flow diagram of operation of the disclosed technique.

FIG. 6 describes overall operation of the disclosed method; additional details are described further below. The method is based on the use of digests as mentioned, which in one embodiment are block hashes 50 stored in a hash table. The remaining description refers to hashes specifically, but those skilled in the art will understand that other types of block digests may be used. Also, this description assumes background operation over a potentially very large set of data, but a modified version may be used in foreground or inline processing of new write commands from the hosts 10.

Referring to FIG. 6, the process may be performed for any desired collection of data, including as much as every block in the data storage system. In one manner of operation, data blocks may initially be stored in a conventional, aligned fashion in response to user I/O, while deduplication (or other reduction process) runs periodically in the background, looking for opportunities to reduce the amount of stored data based on identifying sections of data that are identical other than for a small offset. FIG. 6 shows the processing for one block, and it will be understood that it is repeated for all blocks of the data collection.

At 60, the block is scanned to select a starting position according to a predefined, deterministic criterion. An example technique is described below. The scanning is at a fine-grain granularity, e.g., byte granularity, and is done in a way that will repeatably select the same starting position for identical data. Once a starting position is selected, the scanning is stopped and processing proceeds (as indicated by Exit) to block 62.

At 62 the process calculates a block digest (e.g., hash) for a block-size extent (e.g., 4 KB) of data extending from the starting position (e.g., a specific unaligned byte). In general this extent, which is referred to herein as an "unaligned block", extends across part of the current aligned block and part of the next sequential aligned block. The calculated digest is compared to the stored digests (e.g., by a hash table lookup) to identify a match, if one exists. If so, then at 64 the corresponding unaligned stored block is retrieved with corresponding offset and further processed to confirm an actual match, i.e., the stored unaligned block is compared with the unaligned block for which the digest has been calculated at 60. If the match is confirmed, then the new block can be replaced with a reference to the stored block, along with an offset value indicating the starting position of the unaligned block relative to the stored block being referenced. If at 62 no match is found, then the unaligned block from 60 is a new unique block, and at 66 it is added to the block store 52 along with its offset relative to the preceding aligned block boundary, while its digest/hash is also stored in the collection 50 so that the newly stored block may be discovered in a subsequent iteration of the process for another new block.

It should be noted that as the process of FIG. 6 is repeated across an extent such as in the simple example of Streams 1 and 2, and once a starting position as been selected for a first block of the extent (e.g., BL1), the process may preferably begin subsequent iterations at the same relative starting position in order to readily identify extents having successions of identical blocks. Said another way, the algorithmic selecting of a starting position at 60 (such as described below) may be done once at the beginning of a new extent, and then for subsequent blocks the same starting position is used as long as matches continue to be found at 62-64. When the process exits through the no-match event of step 66, then the next iteration of selection at 60 can again be done using the selection algorithm.

The following is an example process for selecting a starting position in step 60. This example is divided into two steps, a repeated operation referred to as a "sliding window" calculation, and an exit decision Sliding window calculation: This step makes a calculation on a sliding window of block data, every time advancing the window by a certain step (granularity, e.g., a single byte). The calculation may generally be any function that produces a semi-random number for each window, such as a hash function (not to be confused with the block digests/hashes used to identify block identicality). In one example, a window size may be in a range between 4 and 8 bytes for example. The scanning progresses through successive windows of the block data, each time stepping by the desired granularity (e.g., one byte). In each step, the hash function is calculated for the current window data to obtain a resulting window hash value. The window may also be referred to as a "segment" herein. Generally, the step size will be substantially less than the size of the block (e.g., one byte <<4 KB), and the window size is greater than the step size (e.g., 4B>1B).

Exit criteria: Continue the sliding window calculation until an exit criteria is fulfilled, which may generally be any criteria that is statistically well distributed (e.g., 1 out of 4096). In one embodiment, each window hash value is compared to a predefined fixed value, with a match triggering the exit. For example, this exit trigger may be when the window hash value lower bits equal 0xAAA, representing a 1:4096 chance. As a low probability exit point is statistically selected (e.g., 1:4096 within a 4K block), from a block a single block digest/hash is generated.

Other exit methods may require calculating all hashes in the block and selecting a single one, e.g., highest or lowest value.

As a result of the above processing, a hash table 50 is created with hashes that represent blocks with starting points dynamically selected based on block contents (exit criteria) rather than fixed by address alignment. As such, for different data streams with identical but shifted blocks, the starting points can now align. Once the alignment between blocks is known, streams can be scanned (logical-address based forward and backward) and to deduplicate extents of unaligned but otherwise identical blocks.

Figure 7:
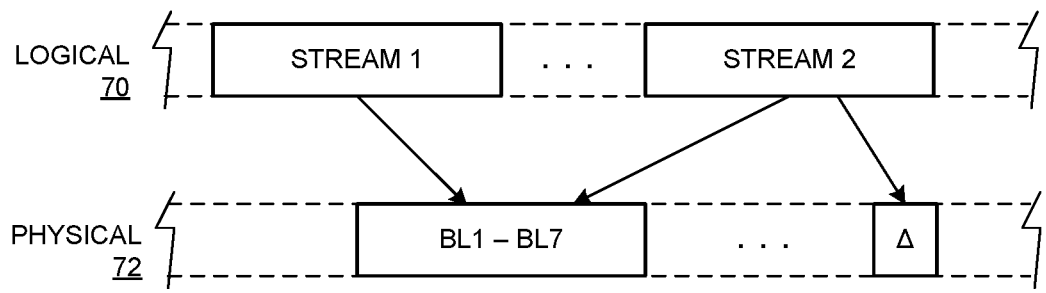
FIG. 7 is a schematic depiction of relationships between a logical space for two streams and underlying physical storage for the data blocks of the streams.

FIG. 7 illustrates a result of the above processing for the simplified example of FIG. 4. The two streams (e.g., files) are stored in a single logical storage space 70, with underlying actual storage shown as physical storage 72. As shown, Stream 1 is stored in logical space 70 as pointers to stored blocks BL1-BL7. Based on the processing as described above, which identifies BL1-BL7 as being shared by Stream 2 with only a small offset, Stream 2 can be stored as a collection of pointers to the unique block Δ as well as to the single physical instance of blocks BL1-BL7, thus realizing a savings of approximately 50% of physical storage requirements in this simple example. More specifically, the Stream 2 pointers may be as follows: $1^{st}$ block points to Δ+BL1, 2nd block points to BL1 and BL2, etc. Because all blocks are the same size and misaligned, each block of Stream 2 points to exactly two blocks where pre and post blocks share a common one in stream 1.

While various embodiments of the invention have been particularly shown and described, it will be understood by those skilled in the art that various changes in form and details may be made therein without departing from the scope of the invention as defined by the appended claims.

What is claimed is:

1. A method of data reduction in a fixed block-based data storage system, comprising:
    selecting a starting position based on a deterministic function of block data content of an aligned block; and
    performing iterations of a loop including (1) for an unaligned block beginning at the starting position of the aligned block, generating a fixed size block digest and comparing the generated block digest with stored block digests of corresponding stored blocks in a block store, (2) when the comparing results in a match, and the corresponding stored block is determined to match the unaligned block, then (a) storing a reference to the stored block in place of the unaligned block, and (b) proceeding to a next iteration of the loop using the selected starting position in a next aligned block, and (3) when the comparing does not result in a match, (a) storing the unaligned block and a corresponding block digest and offset in the block store, and (b) repeating the above steps beginning with the selecting step to select a new starting position in a next aligned block.

2. The method of claim 1, wherein selecting a starting position includes performing a repeated sliding window calculation over successive segments of the aligned block, and making an exit decision based on the sliding window calculation satisfying an exit criterion.

3. The method of claim 2, wherein the sliding window calculation uses a function that produces a semi-random number for each window.

4. The method of claim 3, wherein the sliding window has a window size is in a range from 4 to 8 bytes.

5. The method of claim 2, wherein the sliding window calculations progress through successive windows with a step size substantially less than a size of the aligned block, and the window size is greater than the step size.

6. The method of claim 5, wherein the step size is one byte.

7. The method of claim 2, wherein the exit criterion is statistically well distributed with respect to a block size of the aligned block, promoting calculation of one hash per aligned block.

8. The method of claim 7, wherein the exit criterion is a match between a sliding window calculation result and a predefined fixed value.

9. A data storage system, comprising:
    physical data storage devices for storing a block store of blocks of user data;
    interface circuitry providing respective interfaces to the physical storage devices and to host computers generating storage commands received and executed by the data storage system; and
    processing circuitry configured and operative to store and execute computer program instructions to perform a method of data reduction including:
        selecting a starting position based on a deterministic function of block data content of an aligned block; and
        performing iterations of a loop including (1) for an unaligned block beginning at the starting position of the aligned block, generating a fixed size block digest and comparing the generated block digest with stored block digests of corresponding stored blocks in the block store, (2) when the comparing results in a match, and the corresponding stored block is determined to match the unaligned block, then (a) storing a reference to the stored block in place of the unaligned block, and (b) proceeding to a next iteration of the loop using the selected starting position in a next aligned block, and (3) when the comparing does not result in a match, (a) storing the unaligned block and a corresponding block digest and offset in the block store, and (b) repeating the above steps beginning with the selecting step to select a new starting position in the next aligned block.

10. The data storage system of claim 9, wherein selecting a starting position includes performing a repeated sliding window calculation over successive segments of the aligned block, and making an exit decision based on the sliding window calculation satisfying an exit criterion.

11. The data storage system of claim 10, wherein the sliding window calculation uses a function that produces a semi-random number for each window.

12. The data storage system of claim 11, wherein the sliding window has a window size is in a range from 4 to 8 bytes.

13. The data storage system of claim 10, wherein the sliding window calculations progress through successive windows with a step size substantially less than a size of the aligned block, and the window size is greater than the step size.

14. The data storage system of claim 13, wherein the step size is one byte.

15. The data storage system of claim 10, wherein the exit criterion is statistically well distributed with respect to a block size of the aligned block, promoting the calculation of one hash per aligned block.

16. The data storage system of claim 15, wherein the exit criterion is a match between a sliding window calculation result and a predefined fixed value.

* * * * *